(12) United States Patent
Roy

(10) Patent No.: US 9,922,723 B1
(45) Date of Patent: Mar. 20, 2018

(54) VOLATILE LATCH CIRCUIT WITH TAMPER RESISTANT NON-VOLATILE LATCH BACKUP

(71) Applicant: NXP USA, Inc., Austin, TX (US)

(72) Inventor: Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/407,325

(22) Filed: Jan. 17, 2017

(51) Int. Cl.
G11C 14/00 (2006.01)
G11C 17/18 (2006.01)
G11C 17/16 (2006.01)

(52) U.S. Cl.
CPC .......... G11C 17/18 (2013.01); G11C 14/0081 (2013.01); G11C 17/16 (2013.01)

(58) Field of Classification Search
CPC .............................. G11C 17/18; G11C 14/0081
USPC .................................................. 365/154, 158
See application file for complete search history.

(56) References Cited

U.S. PATENT DOCUMENTS

| | | | |
|---|---|---|---|
| 4,803,659 A | 2/1989 | Hallenbeck | |
| 5,426,614 A * | 6/1995 | Harward | G11C 7/20 257/530 |
| 6,532,169 B1 * | 3/2003 | Mann | G11C 14/00 365/154 |
| 6,985,382 B2 | 1/2006 | Fulkerson et al. | |
| 7,746,695 B2 | 6/2010 | Ivanov et al. | |
| 9,165,631 B2 | 10/2015 | Kim et al. | |
| 2005/0219931 A1 * | 10/2005 | Diorio | G11C 14/00 365/225.7 |
| 2005/0237840 A1 * | 10/2005 | Diorio | G11C 16/0441 365/225.7 |
| 2006/0114020 A1 * | 6/2006 | Taheri | G11C 14/00 326/37 |
| 2008/0101146 A1 * | 5/2008 | Paak | G11C 17/18 365/225.7 |
| 2008/0159042 A1 * | 7/2008 | Bertin | B82Y 10/00 365/225.7 |
| 2010/0271866 A1 * | 10/2010 | Sakimura | G11C 11/16 365/158 |

(Continued)

OTHER PUBLICATIONS

Jan et al, "Demonstration of an MgO Based Anti-Fuse OTP Design Integrated With a Fully Functional STT-MRAM at the Mbit Level", 2015 Symposium on VLSI Technology Digest, Paper T165, 2 pages.

(Continued)

*Primary Examiner* — Hoai V Ho
*Assistant Examiner* — Jay Radke

(57) ABSTRACT

A one-time programmable (OTP) latch includes a memory cell having a first non-volatile (NV) resistive element and a second NV resistive element, cross-coupled inverter circuitry, a first transistor having a first current electrode coupled to a first node of the cross-coupled inverter circuitry and a second current electrode coupled to a first terminal of the first NV resistive element, and a second transistor having a first current electrode coupled to a second node of the cross-coupled inverter circuitry, different from the first node, and a second current electrode coupled to a first terminal of the second NV resistive element. The OTP latch also includes write circuitry coupled to the memory cell and configured to program only one of the first NV resistive element or the second NV resistive element to an OTP state while the cross-coupled inverter circuitry is isolated from the memory cell by the first and second transistors.

20 Claims, 3 Drawing Sheets

(56) References Cited

U.S. PATENT DOCUMENTS

2014/0340957 A1* 11/2014 Wang ................ G11C 11/1673
365/158
2015/0070974 A1* 3/2015 Shuto ................ G11C 14/0081
365/154

OTHER PUBLICATIONS

Na et al.,"A Comparative Study of STT-MTJ Based Non-Volatile Flip-Flops", ISCAS, 2013, 4 pages.
Chiu et al., "Low Store Energy, Low VDDmin, 8T2R Nonvolatile Latch and SRAM With Vertical-Stacked Resistive Memory (Memristor) Devices for Low Power Mobile Applications," IEEE Journal of Solid-State Circuits, vol. 47, No. 6, Jun. 2012, pp. 1483-1496.

* cited by examiner

VOLATILE LATCH CIRCUIT WITH TAMPER RESISTANT NON-VOLATILE LATCH BACKUP

BACKGROUND

Field

This disclosure relates generally to integrated circuits, and more specifically, to volatile latch circuits with one-time programmable latch circuit backup.

Related Art

Memories with resistive storage elements under development across the semiconductor industry are geared to replace conventional random access memory (RAM) and non-volatile memory devices. The resistive memory devices include magnetoresistive random access memory (MRAM), Resistive random-access memory (RRAM or ReRAM), and phase-change memory (PCM), among others. Implementing MRAM technology requires only incremental process steps on top of process steps already performed to manufacture logic devices. MRAM can therefore be embedded with existing base processes for logic devices while providing advantages of low energy write operations, scaled array sizes, fast write performance, and relatively high cycling limits for write operations.

A magnetic tunnel junction (MTJ) MRAM element includes a magnesium oxide (MgO) dielectric sandwiched between two ferromagnetic layers. One dielectric layer is fixed or pinned, and the other dielectric layer is free or unpinned. If the voltage across the MTJ element exceeds the dielectric breakdown of the MgO, then the MTJ element can be used as a one-time programmable (OTP) element. A smaller size MTJ can be used to lower the write current during the OTP MTJ transformation. A OTP memory array can be written and read using the same sensing scheme as an MRAM array, however circuitry for such a sensing scheme has a large overhead when OTP elements are used for latch devices because the OTP latches can be distributed across a system on a chip instead of being limited to a particular location as with an MRAM array.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Systems and methods disclosed herein provide a one-time programmable (OTP) latch system with a non-volatile portion based on magnetoresistive random access memory (MRAM) technology that does not require a reference current or voltage sources for sensing. The OTP latch system can be placed in various locations in a system-on-a-chip since routing lines associated with a current (or voltage) source and local voltage generator are not required. In addition, although magnetic memories can be prone to magnetic field and/or thermal tampering in certain security applications, the non-volatile portion of the OTP latch system disclosed herein is robust against thermal and magnetic tampering.

Figure 1:
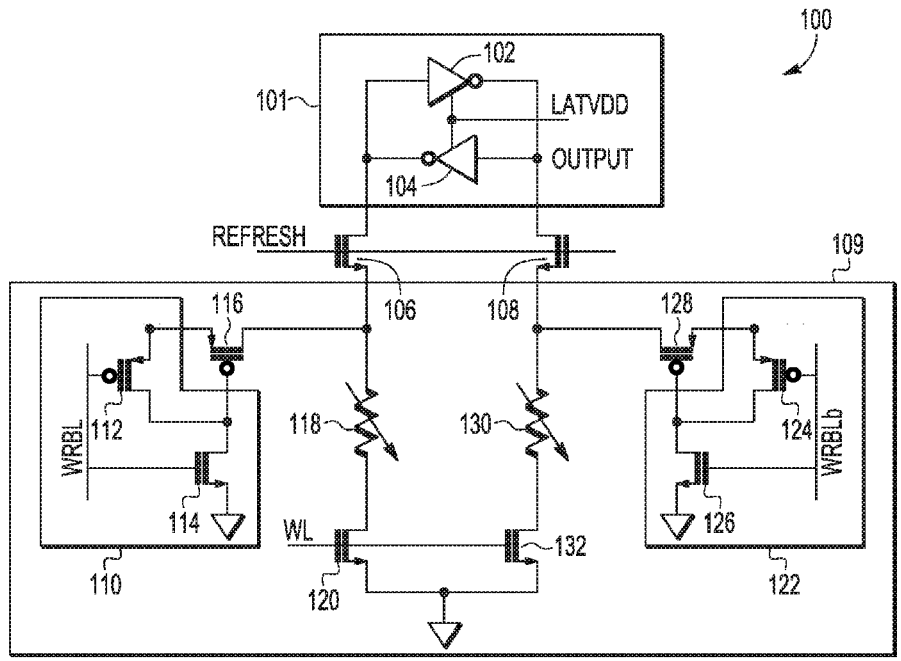
FIG. 1 illustrates a schematic diagram of an embodiment of a one-time programmable (OTP) magnetoresistive random access memory (MRAM) latch system.

FIG. 1 illustrates a schematic diagram of an embodiment of OTP MRAM latch system 100 that includes latch circuit 101 with inverters 102, 104 coupled to OTP circuitry 109 by transistors 106, 108. Inverters 102, 104 are cross-coupled with output of inverter 102 coupled to input of inverter 104, and output of inverter 104 coupled to input of inverter 102. Transistor 106 includes a first current electrode coupled to the input of inverter 102 and the output of inverter 104, a second current electrode coupled to a first terminal of resistive element 118 in OTP circuitry 109, and a gate electrode coupled to a refresh signal. Transistor 108 includes a first current electrode coupled to the output of inverter 102 and the input of inverter 104, a second current electrode coupled to a first terminal of resistive element 130 in OTP circuitry 109, and a gate electrode coupled to the refresh signal.

In OTP circuitry 109, resistive element 118 further includes a second terminal coupled to a first current electrode of transistor 120. A second current electrode of transistor 120 is coupled to ground and a gate electrode of transistor 120 is coupled to a word line (WL). Transistor 132 further includes a second current electrode coupled to ground and a control electrode coupled to the word line. Note that transistors 120 and 132 and the word line are only included when latch system 100 is included in an array with other latch systems (not shown).

OTP circuitry 109 further includes a first inverter 110 with transistors 112 and 114, access transistor 116, second inverter 122 with transistors 124, 126, and access transistor 128. Transistor 112 includes a first current electrode coupled to a first current electrode of transistor 116, a second current electrode coupled to a first current electrode of transistor 114 and a gate electrode coupled to a write bit line (WRBL). Transistor 114 further includes a second current electrode coupled to ground and a gate electrode coupled to the write bit line. Transistor 116 further includes a second current electrode coupled the second current electrode of transistor 106 and the first terminal of resistive element 118, and a gate electrode coupled to the second current electrode of transistor 112 and the first current electrode of transistor 114.

Transistor 124 includes a first current electrode coupled to a first current electrode of transistor 128, a second current electrode coupled to a first current electrode of transistor 126 and a gate electrode coupled to a complementary write bit line (WRBLB). Transistor 126 further includes a second current electrode coupled to ground and a gate electrode coupled to the complementary write bit line. Transistor 128 further includes a second current electrode coupled the second current electrode of transistor 108 and the first terminal of resistive element 130, and a gate electrode coupled to the second current electrode of transistor 124 and the first current electrode of transistor 126.

In the example shown, transistors 106, 108, 114, 120, 126 and 132 are N-channel transistors and transistors 112, 116, 124, 128 are P-channel transistors. Other configurations, of transistors can be used in various embodiments, however.

Note that transistors 116 and 128 are much larger in size relative to transistors 112, 114, 124, 126. For example, the width of transistors 116 and 128 can be 200% larger than the width of transistors 112, 114, 124, 126.

Figure 2:
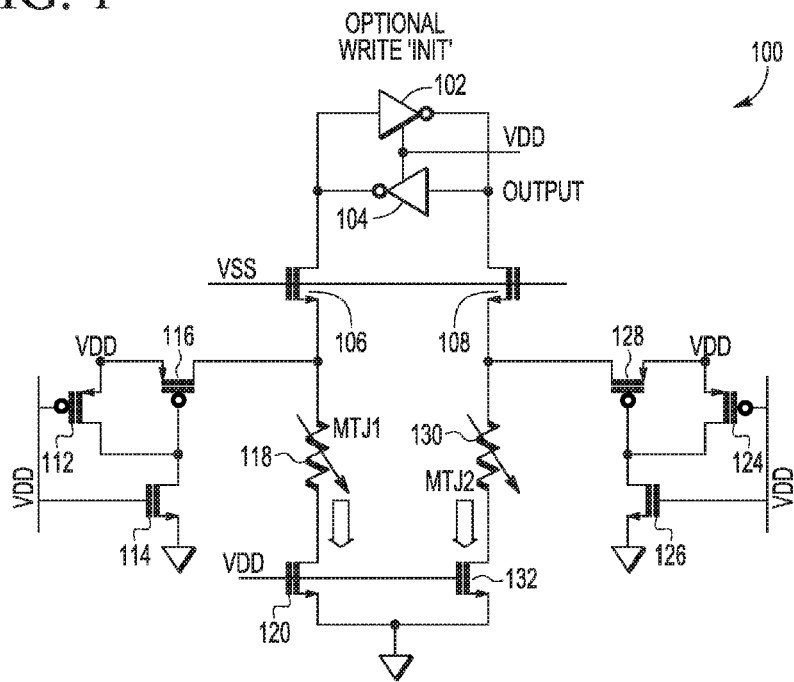
FIG. 2 illustrates the OTP MRAM latch system of FIG. 1 during a write initialization operation.

The operation of OTP MRAM latch system 100 is now explained with reference to FIGS. 2-5. FIG. 2 illustrates the OTP MRAM latch system 100 of FIG. 1 during a write initialization operation. Both resistive elements 118, 130 may be placed in a high resistance state during an initialization operation. In this manner, when a data '1' or '0' is written to OTP circuitry 109, one resistive element will be in a high resistance state and one resistive element will be shorted. During the initialization operation, the refresh signal coupled to the gate electrodes of transistors 106 and 108 is set to supply voltage VSS while write bit line WRBL and complementary write bit line WRBLB are set to supply voltage VDD. Supply voltage VSS is typically set to ground level or zero Volts when transistors 106 and 108 are N-channel transistors. Supply voltage VDD has a greater magnitude than supply voltage VSS. With supply voltage VSS at zero, transistors 106, 108, are non-conducting. With supply voltage VDD non-zero, transistors 112 and 124 are non-conducting and transistors 114, 116, 120, 132, 126 and 128 are conducting. Sufficient current flows through resistive elements 118, 130 to set them both to a high resistance state.

Figure 3:
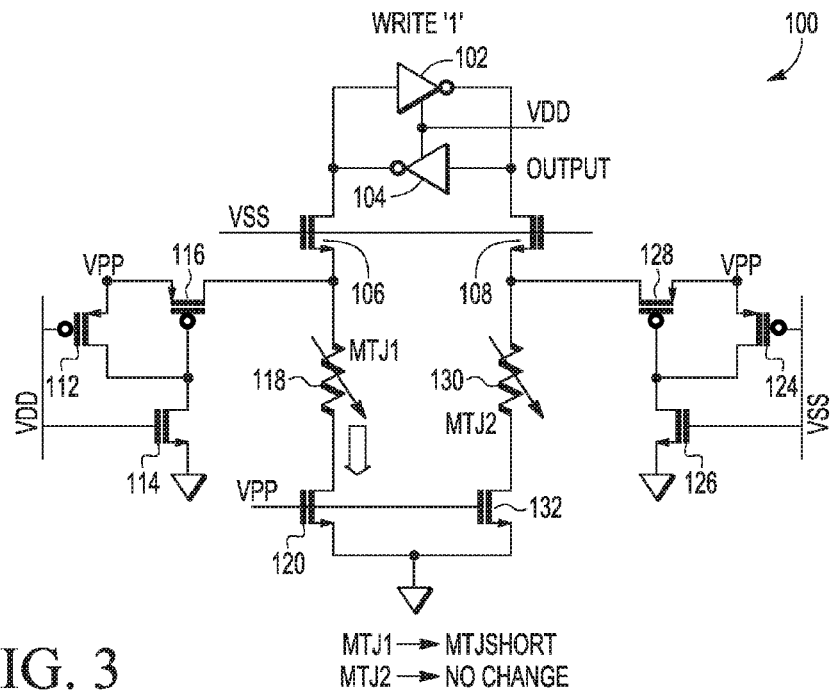
FIG. 3 illustrates the OTP MRAM latch system of FIG. 1 during a write '1' operation.

FIG. 3 illustrates the OTP MRAM latch circuit of FIG. 1 during a write '1' operation during which the refresh signal coupled to the gate electrodes of transistors 106 and 108 is set to supply voltage VSS while write bit line WRBL is set to supply voltage VDD and complementary write bit line WRBLB is set to supply voltage VSS. Word line WL and VPROG are set to programming voltage VPP, which is the same polarity but larger magnitude as supply voltage VDD and places transistors 120 and 132 in conductive mode. With supply voltage VSS at zero, transistors 106 and 108 are non-conducting. With supply voltage VDD non-zero on write bit line WRBL, transistor 112 is non-conducting and transistors 114, 116 are conducting. Sufficient current flows through resistive element 118 from transistor 116 to breakdown the dielectric of resistive element 118, creating a short circuit. With supply voltage VSS being zero on complementary write bit line WRBLB, transistors 126 and 128 are non-conducting and transistor 124 is conducting, enabling the resistance state of resistive element 130 to remain unchanged.

Figure 4:
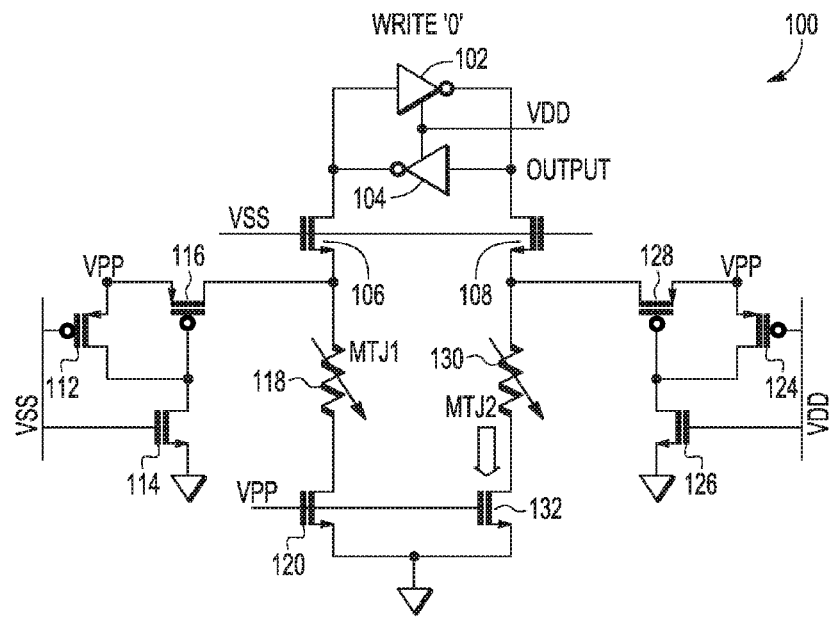
FIG. 4 illustrates the OTP MRAM latch system of FIG. 1 during a write '0' operation.

FIG. 4 illustrates the OTP MRAM latch circuit of FIG. 1 during a write '0' operation during which the refresh signal coupled to the gate electrodes of transistors 106 and 108 is set to supply voltage VSS while write bit line WRBL is set to supply voltage VSS and complementary write bit line WRBLB is set to supply voltage VDD. Word line WL is set to programming voltage VPP, which is the same as supply voltage VDD and places transistors 120 and 132 in conductive mode. With supply voltage VSS at zero, transistors 106, 108, 114 and 116 are non-conducting and transistor 112 is conducting. With supply voltage VSS being zero on write bit line WRBL, the resistance state of resistive element 118 remains unchanged. With supply voltage VDD non-zero on complementary write bit line WRBLB, transistor 124 is non-conducting and transistors 126, 128 are conducting. Sufficient current flows through resistive element 130 from transistor 128 to breakdown the dielectric of resistive element 130, creating a short circuit.

Figure 5:
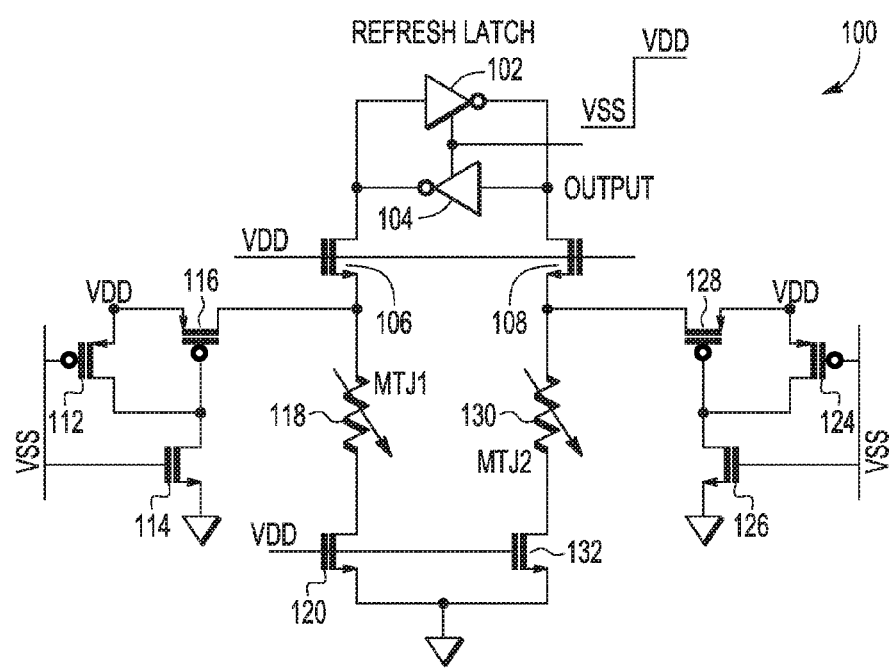
FIG. 5 illustrates the OTP MRAM latch system of FIG. 1 during a refresh operation.

FIG. 5 illustrates the OTP MRAM latch circuit of FIG. 1 during a refresh operation that can be performed to refresh latch circuit 101 after non-volatile OTP circuitry 109 has been programmed to a "1" or a "0". The refresh signal coupled to the gate electrodes of transistors 106 and 108 is set to supply voltage VDD while write bit line WRBL and complementary write bit line WRBLB are set to supply voltage VSS. Word line WL is set to supply voltage VDD, which places transistors 114, 116, 126, and 128 in non-conductive mode and transistors 112 and 124 in conductive mode. With supply voltage VDD being non-zero on the refresh line, latch circuit 101 is refreshed with a '1' if resistive element 118 is shorted, and with a '0' if resistive element 130 is shorted.

With regard to being tamper-proof, when one of resistive elements 118 and 130 is shorted, its resistance value is much lower than when it would be programmed to a high or low resistance state during normal programming. The large difference in resistance values provides substantial read margin, since resistive elements 118, 130 are used differentially to refresh data in latch circuit 101. Thus, even with attempts to thermally or magnetically tamper with the resistance state of resistive elements 118, 130, a large difference in resistance between a shorted resistive element, whose resistance state cannot be changed, and a resistive element changed from a high or low resistance state, or vice versa, will still be sufficient to refresh latch circuit 101.

By now it should be appreciated that in some embodiments, there has been provided a one-time programmable (OTP) latch that can comprise a memory cell (118/130) having a first non-volatile (NV) resistive element (118 or 130) and a second NV resistive element (118 or 130); cross-coupled inverter circuitry (101); a first transistor (106 or 108) having a first current electrode coupled to a first node of the cross-coupled inverter circuitry and a second current electrode coupled to a first terminal of the first NV resistive element; a second transistor (108 or 106) having a first current electrode coupled to a second node of the cross-coupled inverter circuitry, different from the first node, and a second current electrode coupled to a first terminal of the second NV resistive element; and write circuitry (110 and 122) coupled to the memory cell and configured to program only one of the first NV resistive element and the second NV resistive element to an OTP state while the cross-coupled inverter circuitry is isolated from the memory cell by the first and second transistors.

In another aspect, programming the only one of the first NV resistive element and the second NV resistive element to an OTP state can comprise providing a programming current which results in shorting the one of the first NV resistive element and the second NV resistive element.

In another aspect, one of the first and the second node is characterized as an output of the cross-coupled inverter circuitry.

In another aspect, the write circuitry can comprise a first program transistor (116 or 128) having a first current electrode coupled to a first supply voltage terminal, a second current electrode coupled to the first terminal of the first NV resistive element, and a control electrode; a second program transistor (128 or 116) having a first current electrode coupled to the first supply voltage terminal, a second current electrode coupled to the first terminal of the second NV resistive element, and a control electrode; a first inverter (110 or 126) having an input coupled to receive a true data value and an output coupled to the control electrode of the first program transistor; and a second inverter (126 or 110) having an input coupled to receive a complementary data value of the true data value and an output coupled to the control electrode of the second program transistor.

In another aspect, the first inverter (e.g. 110) can comprise a first transistor (112) having a first current electrode coupled to the first supply voltage terminal, a second current electrode corresponding to the output of the first inverter, and a control electrode corresponding to the input of the first inverter; and a second transistor (114) having a first current electrode coupled to the second current electrode of the first transistor of the first inverter, a control electrode coupled to the control electrode of the first transistor of the first inverter, and a second current electrode coupled to a second supply voltage terminal. The second inverter (e.g. 122) can comprise a first transistor (124) having a first current electrode coupled to the first supply voltage terminal, a second current electrode corresponding to the output of the second inverter, and a control electrode corresponding to the input of the second inverter; and a second transistor (126) having a first current electrode coupled to the second current electrode of the first transistor of the second inverter, a control electrode coupled to the control electrode of the first transistor of the second inverter, and a second current electrode coupled to the second supply voltage terminal.

In another aspect, the control electrode of the first transistor and the control electrode of the second transistor can be coupled to a refresh signal.

In another aspect, the cross-coupled inverter circuitry can be configured to latch a state of the memory cell through the first and second transistors in response to assertion of the refresh signal, wherein the state of the memory cell is provided at an output of the cross-coupled inverter circuitry.

In another aspect, the write circuitry can be decoupled from the memory cell while the refresh signal is asserted.

In another aspect, the write circuitry can be further configured to, prior to programming the only one of the first NV resistive element or the second NV resistive element to an OTP state, program each of the first NV resistive element and the second NV resistive element to a high resistive state.

In other embodiments, a method of programming a one-time programmable (OTP) latch having cross-coupled inverter circuitry (101) and having a memory cell having a first non-volatile (NV) resistive element (118 or 130) and a second NV element (130 or 118), wherein the cross-coupled inverter circuitry is coupled to the first NV resistive element and the second NV resistive element, can comprise isolating the cross-coupled inverter circuitry from memory cell. While the cross-coupled inverter circuitry is isolated from the memory cell, providing a programming current through only one of the first NV resistive element or the second resistive element which results in shorting the only one of the first NV resistive element or the second resistive element. After the providing the programming current through only one of the first NV resistive element or the second resistive element, coupling the cross-coupled inverter circuitry to the memory cell and latching a state of the memory cell stored by the combination of the first NV resistive element and the second NV resistive element into the cross-coupled inverter circuitry.

In another aspect, the method can further comprise, after the isolating the cross-coupled inverter circuitry from the memory cell and prior to the providing the programming current through only one of the first NV resistive element or the second resistive element, providing a programming current through the first resistive element to place the first resistive element in a high resistant state and providing a programming current through the second resistive element to place the second resistive element in a high resistant state.

In another aspect, the latching the state of the memory cell comprises differentially sensing the first and the second resistive NV elements by the cross-coupled inverter circuitry.

In another aspect, the method can further comprise providing the state of the memory cell at an output of the cross-coupled inverter circuitry.

In another aspect, when the first NV resistive element is shorted, a first output value is provided at the output of the cross-coupled inverter circuitry and when the second NV resistive element is shorted, a second output value, different from the first output value, is provided at the output of the cross-coupled inverter circuitry.

In still further embodiments, a one-time programmable (OTP) latch can comprise a memory cell (118/130) having a first non-volatile (NV) resistive element (118 or 130) and a second NV resistive element (118 or 130); cross-coupled inverter circuitry (101); isolation circuitry (106) coupled between the cross-coupled inverter circuitry and the memory cell; and write circuitry (110 and 122) coupled to the memory cell and configured to program only one of the first NV resistive element or the second NV resistive element to an OTP state while the cross-coupled inverter circuitry is isolated from the memory cell by the isolation circuitry. The OTP latch can be configured to, during a refresh operation, latch a state of the memory cell stored by the combination of the first NV resistive element and the second NV resistive element into the cross-coupled inverter circuitry via the isolation circuitry.

In another aspect, the isolation circuitry can further comprise a first transistor (106 or 108) having a first current electrode coupled to a first node of the cross-coupled inverter circuitry and a second current electrode coupled to a first terminal of the first NV resistive element; and a second transistor (108 or 106) having a first current electrode coupled to a second node of the cross-coupled inverter circuitry, different from the first node, and a second current electrode coupled to a first terminal of the second NV resistive element.

In another aspect, the first and second transistor can be configured to enter a conductive state during the refresh operation and enter a non-conductive state during the programming only one of the first NV resistive element or the second NV resistive element to an OTP state.

In another aspect, programming the only one of the first NV resistive element and the second NV resistive element to an OTP state comprises providing a programming current which results in shorting the one of the first NV resistive element and the second NV resistive element.

In another aspect, the write circuitry can further comprise a first program transistor (116 or 128) having a first current electrode coupled to a first supply voltage terminal, a second current electrode coupled to the first terminal of the first NV resistive element, and a control electrode; a second program transistor (128 or 116) having a first current electrode coupled to the first supply voltage terminal, a second current electrode coupled to the first terminal of the second NV resistive element, and a control electrode; a first inverter (110 or 126) having an input coupled to receive a true data value and an output coupled to the control electrode of the first program transistor; and a second inverter (126 or 110) having an input coupled to receive a complementary data value of the true data value and an output coupled to the control electrode of the second program transistor.

In another aspect, the write circuitry can be further configured to, prior to programming the only one of the first NV resistive element or the second NV resistive element to an OTP state, program each of the first NV resistive element and the second NV resistive element to a high resistive state.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A one-time programmable (OTP) latch, comprising:
   a memory cell having a first non-volatile (NV) resistive element and a second NV resistive element;
   cross-coupled inverter circuitry comprising two inverters, wherein a first inverter receives an output signal from a second inverter on a first node and the second inverter receives an output signal from the first inverter on a second node;
   a first transistor having a first current electrode coupled to the first node of the cross-coupled inverter circuitry and a second current electrode coupled to a first terminal of the first NV resistive element;
   a second transistor having a first current electrode coupled to the second node of the cross-coupled inverter circuitry, different from the first node, and a second current electrode coupled to a first terminal of the second NV resistive element; and
   write circuitry coupled to the memory cell and configured to program only one of the first NV resistive element and the second NV resistive element to an OTP state while the cross-coupled inverter circuitry is isolated from the memory cell by the first and second transistors.

2. The OTP latch of claim 1, wherein programming the only one of the first NV resistive element and the second NV resistive element to an OTP state comprises providing a programming current which results in shorting the one of the first NV resistive element and the second NV resistive element.

3. The OTP latch of claim 1, wherein one of the first and the second node is characterized as an output of the cross-coupled inverter circuitry.

4. The OTP latch of claim 1, wherein the write circuitry comprises:
   a first program transistor having a first current electrode coupled to a first supply voltage terminal, a second current electrode coupled to the first terminal of the first NV resistive element, and a control electrode;
   a second program transistor having a first current electrode coupled to the first supply voltage terminal, a second current electrode coupled to the first terminal of the second NV resistive element, and a control electrode;
   a first inverter having an input coupled to receive a true data value and an output coupled to the control electrode of the first program transistor; and
   a second inverter having an input coupled to receive a complementary data value of the true data value and an output coupled to the control electrode of the second program transistor.

5. The OTP latch of claim 4,
   wherein the first inverter comprises:
      a first transistor having a first current electrode coupled to the first supply voltage terminal, a second current electrode corresponding to the output of the first inverter, and a control electrode corresponding to the input of the first inverter; and
      a second transistor having a first current electrode coupled to the second current electrode of the first transistor of the first inverter, a control electrode coupled to the control electrode of the first transistor of the first inverter, and a second current electrode coupled to a second supply voltage terminal, and
   wherein the second inverter comprises:
      a first transistor having a first current electrode coupled to the first supply voltage terminal, a second current electrode corresponding to the output of the second inverter, and a control electrode corresponding to the input of the second inverter; and
      a second transistor having a first current electrode coupled to the second current electrode of the first transistor of the second inverter, a control electrode coupled to the control electrode of the first transistor of the second inverter, and a second current electrode coupled to the second supply voltage terminal.

6. The OTP latch of claim 1, wherein the control electrode of the first transistor and the control electrode of the second transistor are coupled to a refresh signal.

7. The OTP latch of claim 6, wherein the cross-coupled inverter circuitry is configured to latch a state of the memory cell through the first and second transistors in response to assertion of the refresh signal, wherein the state of the memory cell is provided at an output of the cross-coupled inverter circuitry.

8. The OTP latch of claim 7, wherein the write circuitry is decoupled from the memory cell while the refresh signal is asserted.

9. The OTP latch of claim 1, wherein the write circuitry is further configured to, prior to programming the only one of the first NV resistive element or the second NV resistive element to an OTP state, program each of the first NV resistive element and the second NV resistive element to a high resistive state.

10. A method of programming a one-time programmable (OTP) latch having cross-coupled inverter circuitry and having a memory cell having a first non-volatile (NV)

resistive element and a second NV element, wherein the cross-coupled inverter circuitry comprises two inverters, wherein a first inverter receives an output signal from a second inverter on a first node and the second inverter receives an output signal from the first inverter on a second node, and is coupled to the first NV resistive element and the second NV resistive element the method comprising:

isolating the cross-coupled inverter circuitry from memory cell;

while the cross-coupled inverter circuitry is isolated from the memory cell, providing a programming current through only one of the first NV resistive element and the second resistive element which results in shorting the only one of the first NV resistive element and the second resistive element; and after the providing the programming current through only one of the first NV resistive element and the second resistive element, coupling the first and second nodes of the cross-coupled inverter circuitry to the memory cell and latching a state of the memory cell stored by the combination of the first NV resistive element and the second NV resistive element into the cross-coupled inverter circuitry.

11. The method of claim 10, further comprising, after the isolating the cross-coupled inverter circuitry from the memory cell and prior to the providing the programming current through only one of the first NV resistive element and the second resistive element, providing a programming current through the first resistive element to place the first resistive element in a high resistant state and providing a programming current through the second resistive element to place the second resistive element in a high resistant state.

12. The method of claim 10, wherein the latching the state of the memory cell comprises differentially sensing the first and the second resistive NV elements by the cross-coupled inverter circuitry.

13. The method of claim 10, further comprising providing the state of the memory cell at an output of the cross-coupled inverter circuitry.

14. The method of claim 13, wherein when the first NV resistive element is shorted, a first output value is provided at the output of the cross-coupled inverter circuitry and when the second NV resistive element is shorted, a second output value, different from the first output value, is provided at the output of the cross-coupled inverter circuitry.

15. A one-time programmable (OTP) latch, comprising:

a memory cell having a first non-volatile (NV) resistive element and a second NV resistive element;

cross-coupled inverter circuitry comprising two inverters, wherein a first inverter receives an output signal from a second inverter on a first node and the second inverter receives an output signal from the first inverter on a second node;

isolation circuitry coupled between the cross-coupled inverter circuitry and the memory cell; and write circuitry coupled to the memory cell and configured to program only one of the first NV resistive element and the second NV resistive element to an OTP state while the cross-coupled inverter circuitry is isolated from the memory cell by the isolation circuitry, wherein the OTP latch is configured to, during a refresh operation, latch a state of the memory cell stored by the combination of the first NV resistive element and the second NV resistive element into the cross-coupled inverter circuitry via the isolation circuitry and the first and second nodes.

16. The OTP latch of claim 15, wherein the isolation circuitry further comprises:

a first transistor having a first current electrode coupled to a first node of the cross-coupled inverter circuitry and a second current electrode coupled to a first terminal of the first NV resistive element; and a second transistor having a first current electrode coupled to a second node of the cross-coupled inverter circuitry, different from the first node, and a second current electrode coupled to a first terminal of the second NV resistive element.

17. The OTP latch of claim 16, wherein the first transistor and second transistor are configured to enter a conductive state during the refresh operation and enter a non-conductive state during the programming only one of the first NV resistive element and the second NV resistive element to an OTP state.

18. The OTP latch of claim 15, wherein programming the only one of the first NV resistive element and the second NV resistive element to an OTP state comprises providing a programming current which results in shorting the one of the first NV resistive element and the second NV resistive element.

19. The OTP latch of claim 15, wherein the write circuitry comprises:

a first program transistor having a first current electrode coupled to a first supply voltage terminal, a second current electrode coupled to the first terminal of the first NV resistive element, and a control electrode;

a second program transistor having a first current electrode coupled to the first supply voltage terminal, a second current electrode coupled to the first terminal of the second NV resistive element, and a control electrode;

a first inverter having an input coupled to receive a true data value and an output coupled to the control electrode of the first program transistor; and a second inverter having an input coupled to receive a complementary data value of the true data value and an output coupled to the control electrode of the second program transistor.

20. The OTP latch of claim 15, wherein the write circuitry is further configured to, prior to programming the only one of the first NV resistive element and the second NV resistive element to an OTP state, program each of the first NV resistive element and the second NV resistive element to a high resistive state.

* * * * *